(12) United States Patent
Mack

(10) Patent No.: US 6,175,248 B1
(45) Date of Patent: Jan. 16, 2001

(54) PULSE WIDTH DISTORTION CORRECTION LOGIC LEVEL CONVERTER

(75) Inventor: Michael P. Mack, San Francisco, CA (US)

(73) Assignee: Level One Communications, Inc., Sacramento, CA (US)

( * ) Notice: Under 35 U.S.C. 154(b), the term of this patent shall be extended for 0 days.

(21) Appl. No.: 09/314,426

(22) Filed: May 18, 1999

(51) Int. Cl.$^7$ .............................................. H03K 19/0175
(52) U.S. Cl. ................................. 326/63; 326/68
(58) Field of Search ................................. 326/63, 68, 80, 326/81, 21; 327/563, 172; 330/255

(56) References Cited

U.S. PATENT DOCUMENTS

| | | | |
|---|---|---|---|
| 4,881,041 | 11/1989 | Kawanabe et al. ................... | 328/112 |
| 5,432,476 | * 7/1995 | Tran ...................................... | 330/255 |
| 5,455,530 | 10/1995 | Huppenthal et al. ................. | 327/175 |
| 5,606,268 | * 2/1997 | Van Brunt .............................. | 326/68 |
| 5,821,809 | * 10/1998 | Boerstler et al. ..................... | 327/563 |

\* cited by examiner

Primary Examiner—David Nelms
Assistant Examiner—David Lam
(74) Attorney, Agent, or Firm—Merchant & Gould P.C.

(57) ABSTRACT

A pulse width distortion correction logic level converter converts differential logic while preserving the pulse width of the original signal. The converter converts a differential input signal to a single-ended signal having a same pulse width as the differential input signal. The present invention receives and converts the differential input signal at a first converter and a second converter, wherein the first converter generates a first output signal, and the second converter generates a second output signal, respectively. Latching the first output signal of the first converter and the second output signal of the second converter produces a full swing single-ended output signal having the same pulse width as the input differential signal. The first output signal sets the latching device with an edge of the first output signal of the first converter and resets the latching device with an edge of the second output signal of the second converter. The first and second output signals generate a full swing single-ended output signal width that is not sensitive to an absolute delay through the first and second converters.

17 Claims, 5 Drawing Sheets

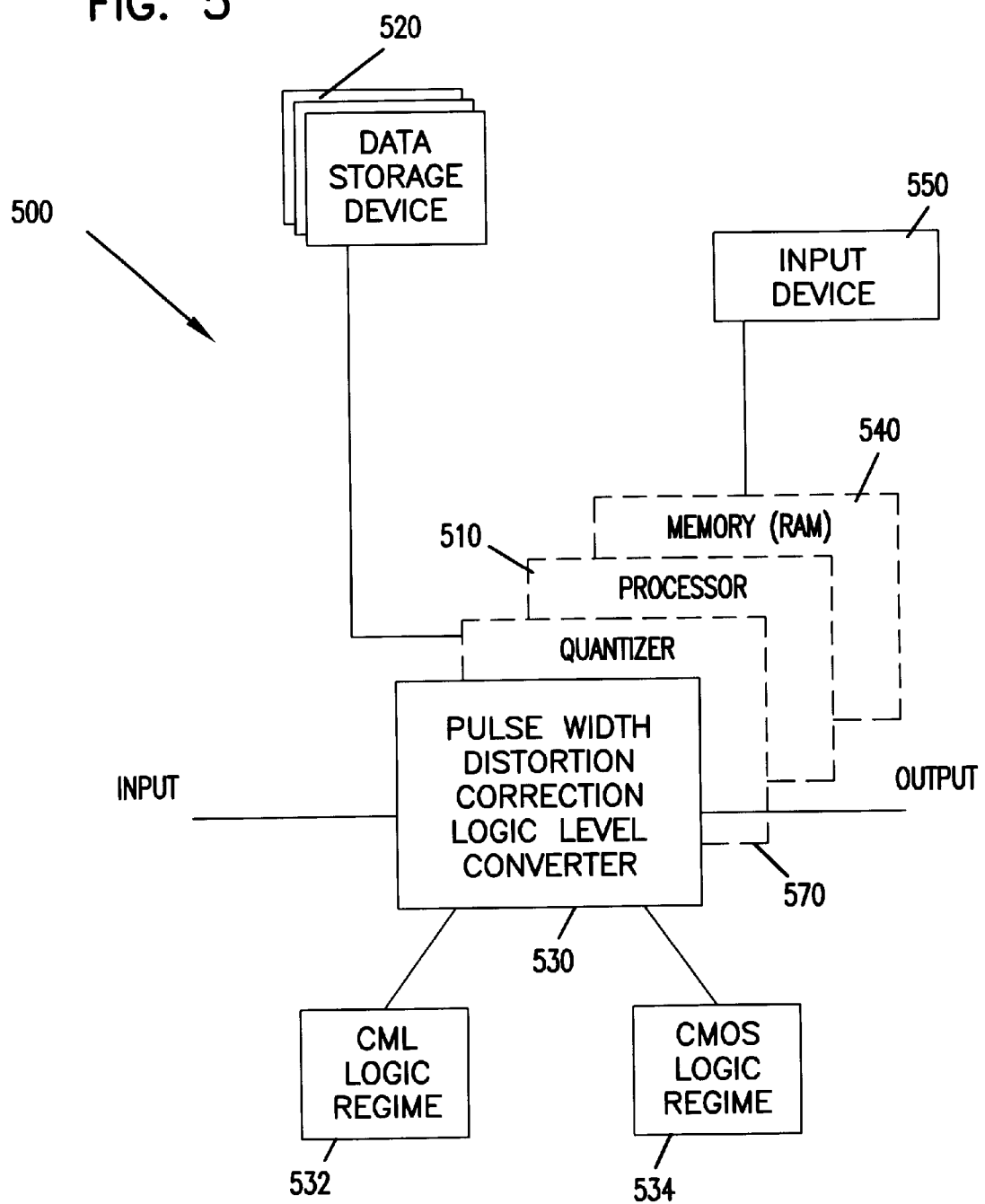

PULSE WIDTH DISTORTION CORRECTION LOGIC LEVEL CONVERTER

BACKGROUND OF THE INVENTION

1. Field of the Invention

This invention relates in general to a pulse width distortion correction logic level converter, and more particularly to a converter that converts differential logic while preserving the pulse width of the original signal.

2. Description of Related Art

In the early 1980's a new movement in computer architecture began with the development of reduced instruction set computers, commonly referred to as RISC machines. The overall design philosophy was to keep the computer hardware as simple as possible but extremely fast.

Because the RISC movement started during the advent of the silicon revolution, most RISC processors have been implemented in silicon using metal-oxide semiconductor field-effect devices, or MOSFETs for short. MOSFETs have been the predominant device in the industry due to their simple structure, low-cost fabrication and high integration levels. Although other technologies (most notably bipolar junction transistors, or BJTs) have better performance than MOSFETs, the development of complimentary MOS devices (CMOS) dramatically reduced circuit power consumption levels and provided a technological edge in terms of power vs. performance.

In recent years bipolar devices have been overlooked for use in nearly all processors, primarily due to the conventional premise that bipolar circuits have higher power consumption. Because static CMOS circuits do not provide a direct path between power and ground, power is dissipated primarily when the circuit is switching and results in a dependence between power dissipation and frequency. In contrast, current-mode bipolar circuits have a constant flow of current (and hence higher static power dissipation) but the power dissipation does not increase significantly with frequency. Therefore, bipolar circuits may run faster and consume less power than CMOS circuits.

Current mode logic (CML) bipolar circuit technology is implemented for a variety of reasons. Current mode logic is inherently fast due primarily to current-steering and the avoidance of transistor saturation, has relatively few components and is simple to design. One essential characteristic of a current mode logic circuit is the use of two related but varying voltages rather than one variable node and a fixed reference potential.

Current mode logic is referred to as a differential circuit and the signals are called differential signals. The ability to reject noise present on both inputs is called common-mode rejection and current mode logic is more suitable for a high-speed digital environment. Differential circuit technology has some other unique advantages over single-ended circuits such as the elimination of reference voltages and "free" inversions for digital logic just switch the input signals).

There are also some disadvantages to differential logic. Since both wires in a differential pair switch simultaneously, the change in potential is effectively twice the absolute voltage swing of the wires. Because each wire experiences an effective voltage swing of twice the actual change, the capacitive coupling between the wires is also doubled.

On the other hand, the capacitance of a single node is generally reduced because a ground plane of a semi-insulating substrate is typically further away. One solution is to route differential signals apart from each other to reduce the effective voltage swing, but this can present more serious problems with noise. Both wires in a differential pair should be routed side-by-side in order to ensure that any noise is injected onto both signals in a differential pair and is rejected due to the common mode rejection property of CML. If wires are routed separately, the injected noise may not be identical and may not be rejected from the circuit output.

Therefore, when logic families are combined, such as current mode logic with CMOS, this allows limited voltage swing differential inputs to produce a single-ended CMOS output. However, this high speed, low power general purpose differential to single-ended converter induces propagation delays in a circuit design.

For example, the leading and trailing edge delays within the CML to CMOS converter are not required to match creating the pulse width distortion in an output signal of the converter.

It can be seen then that there is a need for a pulse width distortion correction logic level converter.

Specifically, to a converter that converts a small swing differential logic signal into full swing complementary metal-oxide semiconductor signal while preserving the pulse width of the original signal.

SUMMARY OF THE INVENTION

To overcome the limitations in the prior art described above, and to overcome other limitations that will become apparent upon reading and understanding the present specification, the present invention discloses a pulse width distortion correction logic level converter, and more particularly to a converter that converts a small swing differential logic signal into full swing complementary metal-oxide semiconductor (CMOS) signal while preserving the pulse width of the original signal.

The present invention solves the above-described problems by providing a circuit that determines the pulse width distortion between two CML to CMOS converters. Specifically, by matching a leading edge delay between two CML to CMOS converters as well as determining the difference between a set and a reset delay on a latch.

A system in accordance with the principles of the present invention includes converting signals from a source by receiving a differential input signal and converting the differential input signal to a single-ended signal having a same pulse width as the differential input signal.

Other embodiments of a system in accordance with the principles of the invention may include alternative or optional additional aspects. One such aspect of the present invention is that the receiving and converting further includes receiving the differential input signal at a first and second converters, wherein the first converter generates a first output signal and the second converter generates a second output signal, respectively. Also, a latching device to latching the first output signal of the first converter and the second output signal of the second converter to produce a fill swing single-ended output signal having the same pulse width as the input differential signal.

Another aspect of the present invention is that the converting of the differential input signal further includes converting the differential input signal to the first converter having a polarity and converting the differential input signal to the second converter having a reversed polarity.

Another aspect of the present invention is that the latching of the first and second output signals further includes setting the latching device with an edge of the first output signal of the first converter and resetting the latching device with an edge of the second output signal of the second converter.

Another aspect of the present invention is that the latching of the edge of the first and second output signals generate a full swing single-ended output signal width that is not sensitive to an absolute delay through the first and second converters.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout:

FIG. 5 is an exemplary hardware environment for the pulse width distortion correction logic level converter.

DETAILED DESCRIPTION OF THE INVENTION

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The primary design issue of the pulse width distortion correction logic level converter (pulse width converter) is for the circuit to convert a small swing differential logic signal into full swing CMOS while preserving the pulse width of the original signal.

In a typical conversion from a CML signal to a CMOS signal, the leading and trailing edge delays within the CML to CMOS converter are not required to match. Instead, the pulse width converter is determined by leading edge delay matching between the two identical CML to CMOS converters as well as the difference between set and reset delays of the latch. This simplifies its design.

Figure 1:
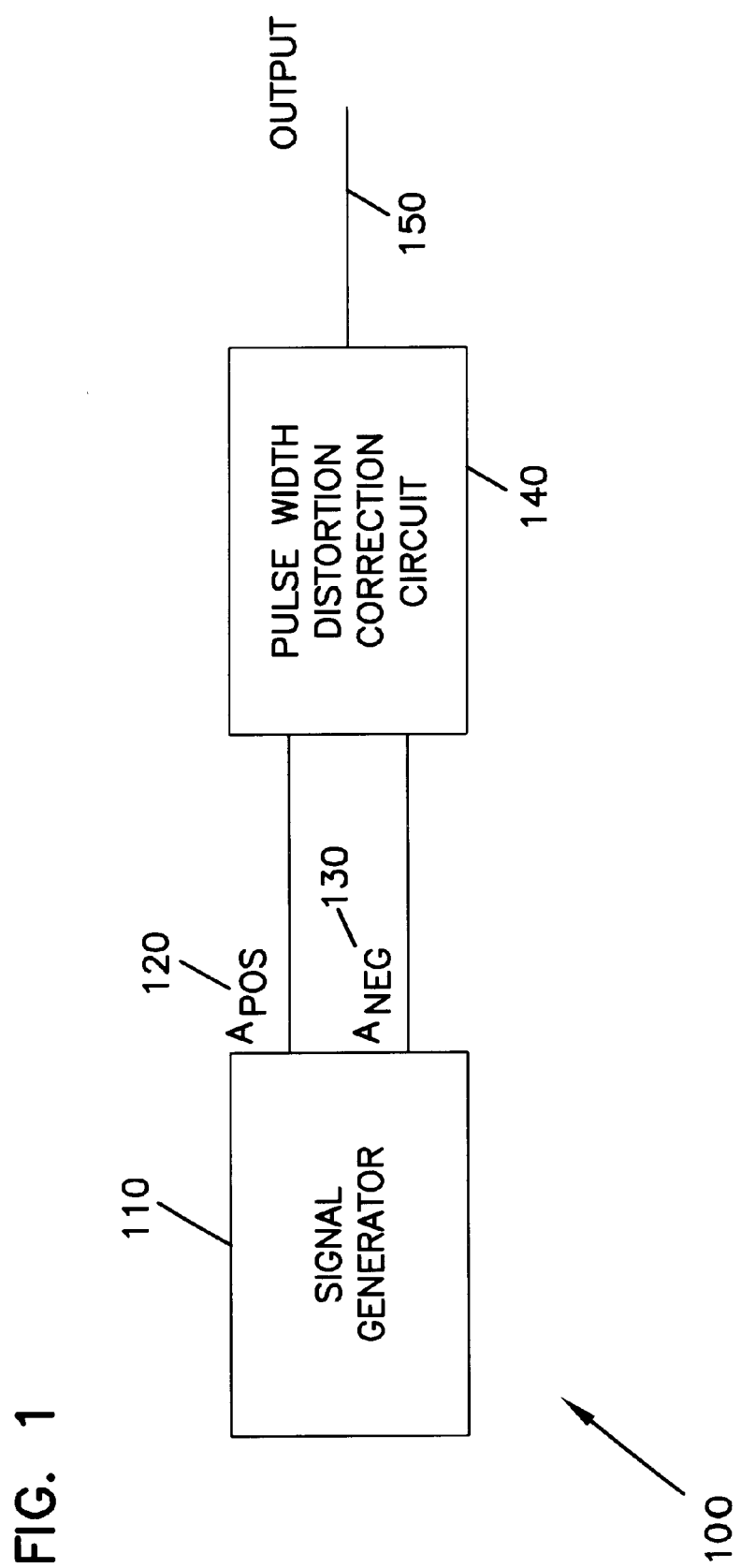
FIG. 1 is a diagram showing a pulse width distortion correction logic level converter in a typical system.

FIG. 1 is a diagram showing the pulse width distortion correction logic level converter 140 in a typical system according to the present invention 100. A signal generator 110 generates a positive component of a small swing differential logic signal ($A_{pos}$) 120 and a negative component of the small swing differential logic signal ($A_{neg}$) 130, which are the inputs to the pulse width converter 140.

The pulse width converter 140 modifies the input signals and provides a non-distorted full swing CMOS output signal 150 having a same pulse width as the positive component 120 and the negative component 130 of the generated signal. This modification allows the combination of different logic families without pulse width distortion to be utilized by subsequent circuitry.

Figure 2:
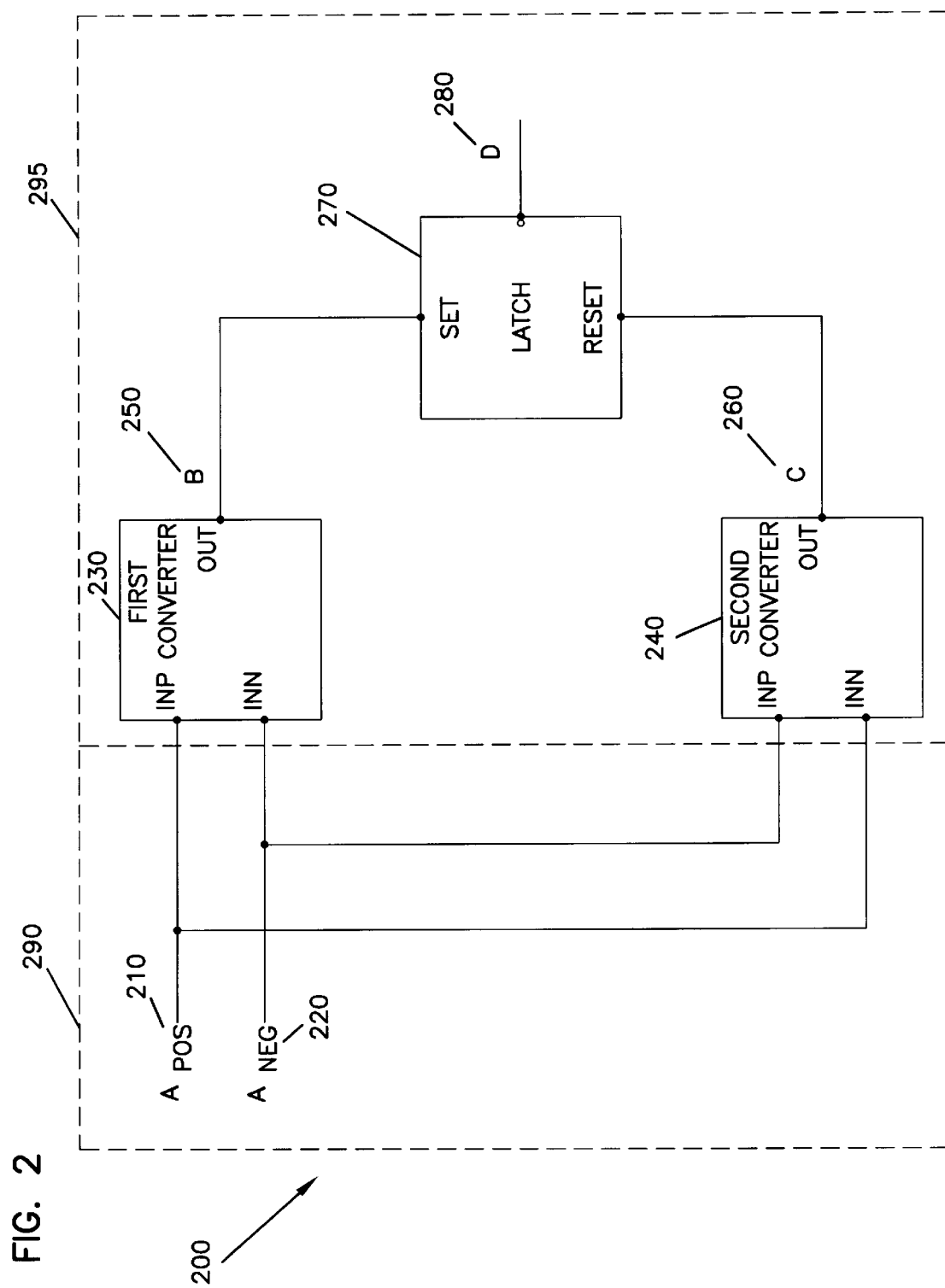
FIG. 2 is a block diagram of the pulse width distortion correction logic level circuit.

FIG. 2 is a block diagram of the pulse width distortion correction logic level circuit according to the present invention 200. The goal of this circuit is to convert a small swing differential logic signal into a full swing CMOS while preserving the pulse width of the original signal. Referring to FIG. 2, this is done by using two identical CML to CMOS converters, a first converter 230 and a second converter 240. The positive 210 and negative 220 signals in the receive circuit 290 are input to the first converter 230 and the second converter 240. The first converter 230 creates the a first output signal (B) 250 which is a single ended representation of the input signals represented by $V(A_{pos}, A_{neg})$ while the second converter 240 creates a second output signal (C) 260 which is a single ended representation of $V(A_{neg}, A_{pos})$ in the converter circuit 295. The first output signal 250 and the second output signal 260 is then used to set and reset a latching device 270, respectively. The output pulse width of this circuit is not sensitive to the absolute delay through the CML to CMOS converters, first converter 230 and second converter 240, because only the leading edges of the first output signal 250 and the second output signal 260 are used to trigger the latching device 270. A single-ended output signal (D) 280 has the same pulse width as the input differential signal $V(A_{pos}, A_{neg})$ even though the CML to CMOS converters 230, 240 have different leading and trailing edge delays.

The advantage of converting the signal in this manner is that the leading and trailing edge delays within the CML to CMOS converters 230, 240 used for the first converter 230 and the second converter 240 are not required to match. Instead, the pulse width distortion of the single-ended output signal 280 is determined by the leading edge delay matching between the two identical CML to CMOS converters, first converter 230 and second converter 240, as well as the difference between the set and reset delays of the latching device 270. This simplifies its design.

Figure 3:
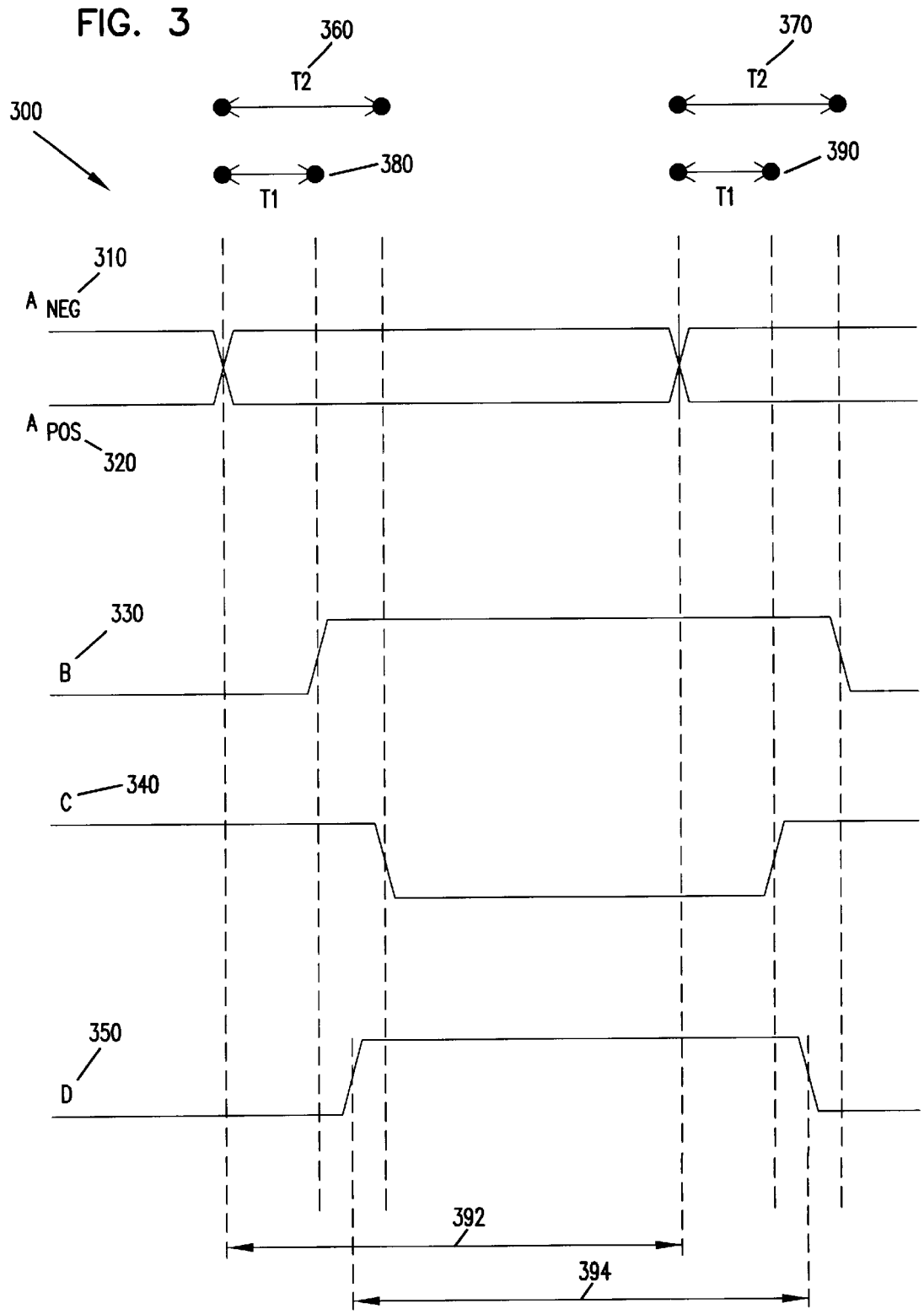
FIG. 3 illustrates a timing diagram of the pulse width distortion correction logic level converter circuit.

FIG. 3 illustrates a timing diagram of the pulse width distortion correction logic level converter signals according to the present invention 300. The timing diagram shown here is the output of the particular signals in FIG. 2. The differential logic signals $A_{neg}$ 310 and Apo 320 are the inputs to the first and second converters. The timing signals T1 380, 390 and T2 360, 370 denote the delays between the first and second converters and the latching device. As depicted in the illustration the first converter creates the first output signal (B) 330 which is a signal ended representation of $V(A_{pos}, A_{neg})$ while the second converter creates the second output signal (C) 340 which is a single ended representation $V(A_{neg}, A_{pos})$. The first output signal 330 and the second output 340 are used to set and reset the latching device. The output pulse width of this circuit is not sensitive to the absolute delay through the CML to CMOS converters, first converter and second converter, because only the leading edges of the first output signal 330 and second output signal 340 are used to trigger the latch. The single-ended output signal (D) 350 has the same width as the differential signal $V(A_{pos}, A_{neg})$ even though the CML to CMOS converters have different leading and trailing edge delays as depicted by T1 380, 390 and T2 360, 370. Those skilled in the art will realize that the pulse width of the input signals $A_{neg}$ 310 and $A_{pos}$ 320, as depicted by the first measurement 392, is the same as the single-ended output signal 350 which is illustrated by the measurement 394. Further the diagram illustrates that the leading edge of $A_{pos}$, 320 triggers the rising edge or the setting of the latching device via the rising edge of the first output signal 330 at some time T1 380 after the leading edge of $A_{pos}$ 320 is encountered. The setting of the latching device via the leading edge of the second output signal 330 triggers the assertion of the single-ended output signal 350. In the same respect the rising or leading edge of $A_{neg}$ 310 triggers the rising edge or the resetting of the latching device via the rising edge of the second output signal C 340 at some time T1 390 after the detection of the rising edge of $A_{neg}$ 310. Further the rising edge or the resetting of the latching device via the second output signal 340 will de-assert the output single-ended output signal 350. Therefore, in this simplistic design the pulse width distortion of the single-ended output signal 350 is determined by the leading edge delay matching between the two identical CML to CMOS converters, first converter and second converter, as well as the difference between the set and reset delays triggered by the first output signal 330 and the second output signal 340, respectively. The single-ended output signal 350 has the same pulse width as the input differential signal $V(A_{pos}, A_{neg})$ even though the CML to CMOS converters have different leading and trailing edge delays as depicted by T1 380, 390 and T2 360, 370.

Figure 4:
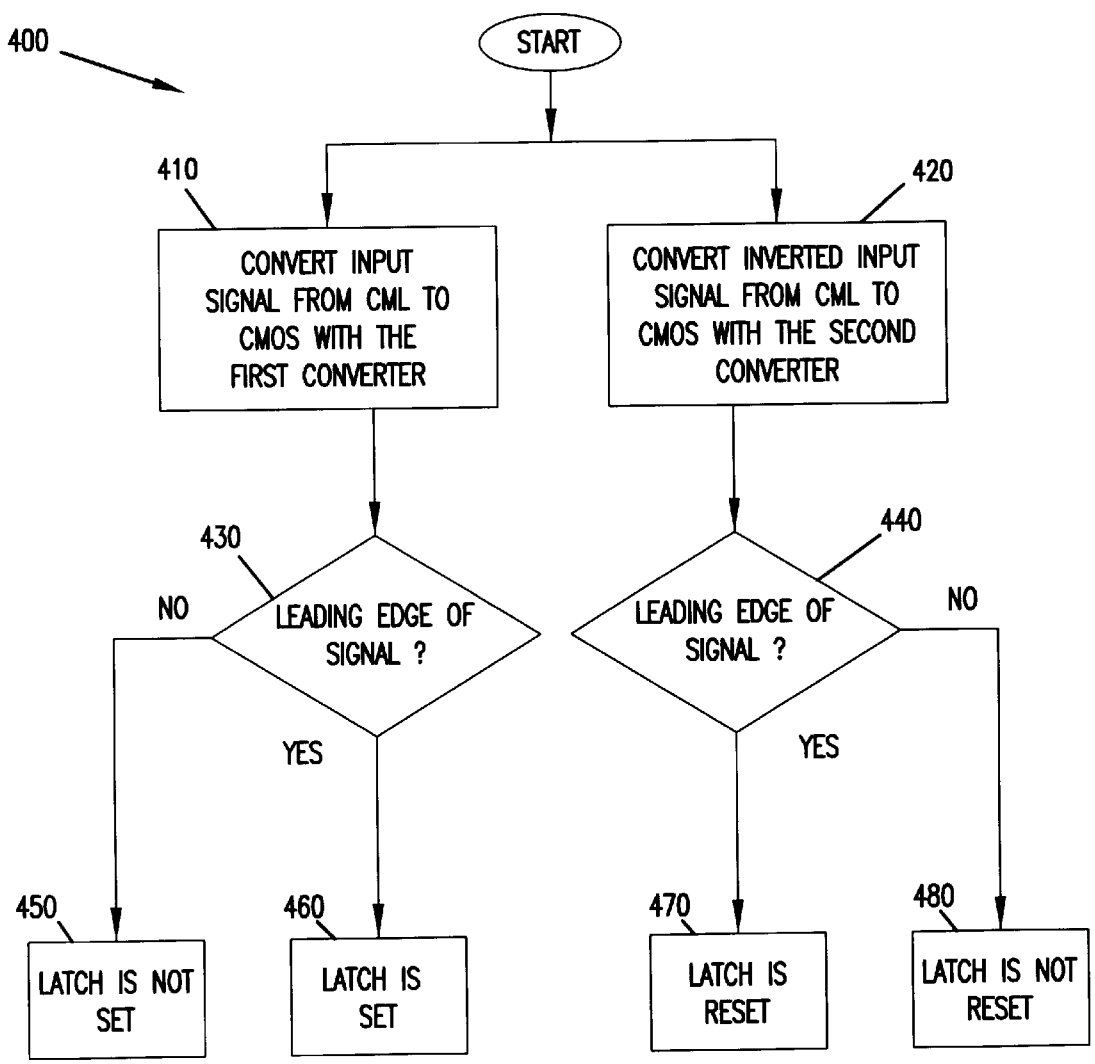
FIG. 4 is a signal flow diagram illustrating a method of the pulse width distortion correction logic level converter circuit according to the present invention.

FIG. 4 is a signal flow diagram illustrating a method of the pulse width distortion correction logic level converter according to the present invention 400. The flow chart illustrates a conversion of the input signal from CML to CMOS in the first converter 410. Further, the inverted input signal is converted from CML to CMOS in the second converter 420. The output of the first converter is detected by the latching device in 430. If the latching device detects a rising edge from the output of the first converter, the output of the latching device will be asserted 460. If the latching device does not see a leading edge from the signal from the first converter, the latch will not be set 450. If a rising edge signal from the second converter is detected at the reset pin on the latching device in 440, the latching device will assert the output signal 470. If the latching device does not see an asserted signal at the reset pin from the second converter the output of the latching device will not be asserted or reset 480.

FIG. 5 is an exemplary hardware environment for the pulse width distortion correction logic level converter according to the present invention 500. The present invention may be implemented using a pulse width distortion correction logic level converter 530, a processor 510 and memory (RAM) 540. It is envisioned that coupled to the pulse width distortion correction logic level converter 530 may be a memory device 540. Also included in this embodiment may be input devices 550, for downloading data and commands.

The pulse width distortion correction logic level converter 530 may operate under the control of an operating system. The pulse width distortion correction logic level converter 530 maintains the pulse widths of critically timed signals passing form a CML logic regime 532 to a CMOS logic regime 534.

Generally, the operating system may be tangibly embodied in a computer-readable medium or carrier, e.g. one or more of the fixed or removable data storage devices 520, or other data storage or data communications devices. A quantizer 570 may be used for conversion of the analog signals to digital signals between the pulse width distortion correction logic level converter 530 any connecting digital devices. Both operating system and the computer programs may be loaded from the data storage devices into the memory 540 of the pulse width distortion correction logic level converter 530 for execution by the processor 510. Those skilled in the art will recognize that the memory 540 is optional, or may be a memory device embedded or otherwise couple to the pulse width distortion correction logic level converter 530. The operating system comprises instructions which, when read and executed by the processor 510, executes the steps or elements of the present invention.

Although one system configuration is illustrated in FIG. 5, those skilled in the art will recognize that any number of different configurations performing similar functions may be used in accordance with the present invention.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method of converting signals from a source, comprising:

receiving a differential input signal;

converting the differential input signal to a first output signal and a second output signal; and latching the first and second output signals using a latch device to output a single-ended signal having a same pulse width as the differential input signal.

2. The method of claim 1, wherein the receiving further comprises:

receiving the differential input signal at a first converter; and receiving the differential input signal at a second converter.

3. The method of claim 2, wherein the converting further comprises:

converting the differential input signal at the first converter to the first output signal;

converting the differential input signal at the second converter to the second output signal; and wherein the latching of the first output signal of the first converter and the second output signal of the second converter using the latching device produces a full swing single-ended output signal having the same pulse width as the differential input signal.

4. The method of claim 3, wherein the converting the differential input signal further comprises converting the differential input signal to the first converter having a polarity and converting the differential input signal to the second converter having a reversed polarity.

5. The method of claim 3, wherein the latching the first and second output signals further comprises setting the latching device with an edge of the first output signal of the first converter and resetting the latching device with an edge of the second output signal of the second converter.

6. The method of claim 5, wherein the latching of the edge of the first and second output signals generates a full swing single-ended output signal width that is not sensitive to an absolute delay through the first and second converters.

7. A logic converter for converting signals from a source, comprising:
- a receiver circuit for receiving a differential input signal; and
- a converter circuit for converting the differential input signal to a first output signal and a second output signal, the converter circuit including a latch device for latching the first and second output signals to output a single-ended signal having a same pulse width as the differential input signal.

8. The logic converter of claim 7, wherein the converter circuit further comprises:
- a first converter for converting the differential input signal to the first output signal;
- a second converter for converting the differential input signal to the second output signal; and
- wherein the latching device latches the first output signal of the first converter and the second output signal of the second converter to produce a full swing single-ended output signal having the same pulse width as the input differential signal.

9. The logic converter of claim 8, wherein the receiver converts the differential input signal to the first converter having a polarity and converts the differential input signal to the second converter having a reversed polarity.

10. The logic converter of claim 8, wherein the latching device is set by an edge of the first output signal of the first converter and reset by an edge of the second output signal of the second converter.

11. The logic converter of claim 10, wherein the latching device generates a full swing single-ended output signal width that is not sensitive to an absolute delay through the first and second converters.

12. A system for converting signals from a source, comprising:
- a signal generator for generating a differential input signal;
- a receiver circuit for receiving the differential input signal; and
- a converter circuit for converting the differential input signal to a first output signal and a second output signal, the converter circuit including a latch device for latching the first and second output signals to output a single-ended signal having a same pulse width as the differential input signal.

13. The system of claim 12, wherein the converter circuit further comprises:
- a first converter for converting the differential input signal to the first output signal;
- a second converter for converting the differential input signal to the second output signal; and
- wherein the latching device latches the first output signal of the first converter and the second output signal of the second converter to produce a full swing single-ended output signal having the same pulse width as the input differential signal.

14. The system of claim 13, wherein the receiver provides the differential input signal to the first converter having a polarity and provides the differential input signal to the second converter having a reversed polarity.

15. The system of claim 13, wherein the latching device is set by an edge of the first output signal of the first converter and reset by an edge of the second output signal of the second converter.

16. The system of claim 15, wherein the latching device generates a full swing single-ended output signal width that is not sensitive to an absolute delay through the first and second converters.

17. A computer program storage medium readable by a computing system and encoding a computer program of instructions for executing a computer process for converting signals from a source, the computer process comprising:
- receiving a differential input signal;
- converting the differential input signal to a first output signal and a second output signal; and
- latching the first and second output signals using a latch device to output a single-ended signal having a same pulse width as the differential input signal.

* * * * *